June 28, 1960 O. E. MATTIAT 2,943,278

PIEZOELECTRIC FILTER TRANSFORMER

Filed Nov. 17, 1958 2 Sheets-Sheet 1

INVENTOR,
OSKAR E. MATTIAT.

BY Harry M. Saragovitz

ATTORNEY.

June 28, 1960 O. E. MATTIAT 2,943,278

PIEZOELECTRIC FILTER TRANSFORMER

Filed Nov. 17, 1958 2 Sheets-Sheet 2

*INVENTOR.*
OSKAR E. MATTIAT

*BY* Harry M. Saragovitz
ATTORNEY

United States Patent Office 2,943,278
Patented June 28, 1960

2,943,278

PIEZOELECTRIC FILTER TRANSFORMER

Oskar E. Mattiat, Santa Barbara, Calif., assignor to the United States of America as represented by the Secretary of the Army Filed Nov. 17, 1958, Ser. No. 774,563

6 Claims. (Cl. 333—32)

This invention relates to piezoelectric filter transformers for alternating current waves and more particularly to piezoelectric disk filter-impedance transformers operating at radio frequencies.

Intermediate frequency amplifiers, for example, usually employ bandpass circuits, of some sort, for passing a desired band of frequencies. For this application I.-F. transformers consisting of two or more tuned circuits with some method of coupling the tuned circuits are utilized.

In addition to passing a desired band of frequencies, these transformers should, for maximum power transfer, match the output impedance of one amplifier stage to the input impedance of the following stage.

However, since the input impedance of a vacuum tube is quite independent of its output impedance, and since usually one is more concerned about the I.-F. transformer circuit having a high Q than with maximum power transfer, the requirement for impedance matching is usually neglected in favor of other design considerations.

With the wide-spread use of transistors, a great need appears for a miniaturized high Q transformer capable of operating at radio-frequencies and exhibiting good impedance transformation characteristics. Since the input impedance of a transistor amplifier is dependent on its output impedance, and since maximum power transfer is very desirable in the design of transistor amplifiers, the desirability of selective interstage impedance matching networks may be readily seen.

Piezoelectric elements are often used as two-terminal components in frequency selective networks in combination with conventional reactive circuit elements. In recent years, piezoelectric ceramic materials have found many new applications as electromechanical resonators and transducers. In many applications the use of ceramic materials is even preferred over pure quartz crystals. While quartz crystals have excellent properties as far as stability and mechanical strength are concerned, they are, however, limited to a relatively narrow bandwidth of less than one percent. This results from the small electromechanical coupling coefficient of approximately ten percent.

It is therefore, an object of this invention to utilize a piezoelectric element as a frequency selective impedance transformer.

It is a further object of the present invention to utilize a piezoelectric ceramic disk as a four-terminal impedance transformer having input and output electrodes.

It is another object of the present invention to utilize a piezoelectric ceramic disk as a miniaturized I.-F. transformer having input and output electrodes.

It is an additional object of this invention to provide barium titanate resonant filter transformers which permit reductions in size and cost with increased ruggedness and better skirt selectivity.

It is, however, the main object of this invention to provide a piezoelectric filter transformer whose voltage and impedance transformation characteristics can be readily and inexpensively varied over a wide range.

These and other objects are obtained by using a piezoelectric ceramic disk having two centrally located input electrodes and two split segment ring electrodes. The physical dimensions of the disk and the location of the electrodes are primarily determined by the operating frequency range and the desired frequency response. The number of split segments on each outer ring electrode determines the voltage and impedance transformation characteristics of the filter-transformer.

Accordingly, the present invention teaches the exact location of the electrodes on a piezoelectric disk filter-transformer and the means for readily changing the voltage and impedance transformation ratio therein.

Piezoelectric disks can be used as four terminal networks because of their excellent characteristics in the radial mode of vibration. The term "piezoelectric" includes not only naturally found piezoelectric materials, such as quartz, but also those materials, such as barium titanate, which become piezoelectric after proper polarization. The latter materials are commonly labelled, in the art, as "ferroelectric" materials because of the hysteresis properties which they exhibit. Since great progress has been recently made in the art of polarizing these ferroelectric materials, they are usually preferred over the naturally found piezoelectric substances.

A disk in resonant radial vibration, to be capable of use as a four-terminal selective network, must have a minimum of three electrodes, one electrode being common to the input and the output terminals. The placement and the geometrical configuration of the electrodes for maximum effectiveness depend upon three major considerations:

(1) An electrode placed at a point of maximum stress will yield the greatest voltage output or, inversely, provide the greatest excitation stress.

(2) Proper placement of electrodes may partially or completely eliminate unwanted overtones and/or the fundamental.

(3) The number and the shape of the electrodes will vary the transformation characteristics of the disk.

The above considerations and this invention with its attendant advantages will be better understood by reference to the following detailed description when considered in connection with the accompanying drawings in which.

Figure 1:
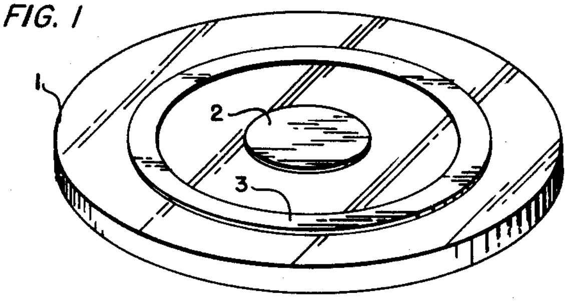
Fig. 1 is a perspective view of a known type of a ring-electroded, piezoelectric ceramic disk.
Figure 2:
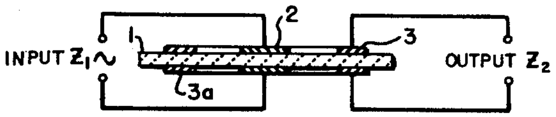
Fig. 2 is a schematic diagram of a ring-electroded piezoelectric ceramic disk acting as a filter element.
Figure 2A:
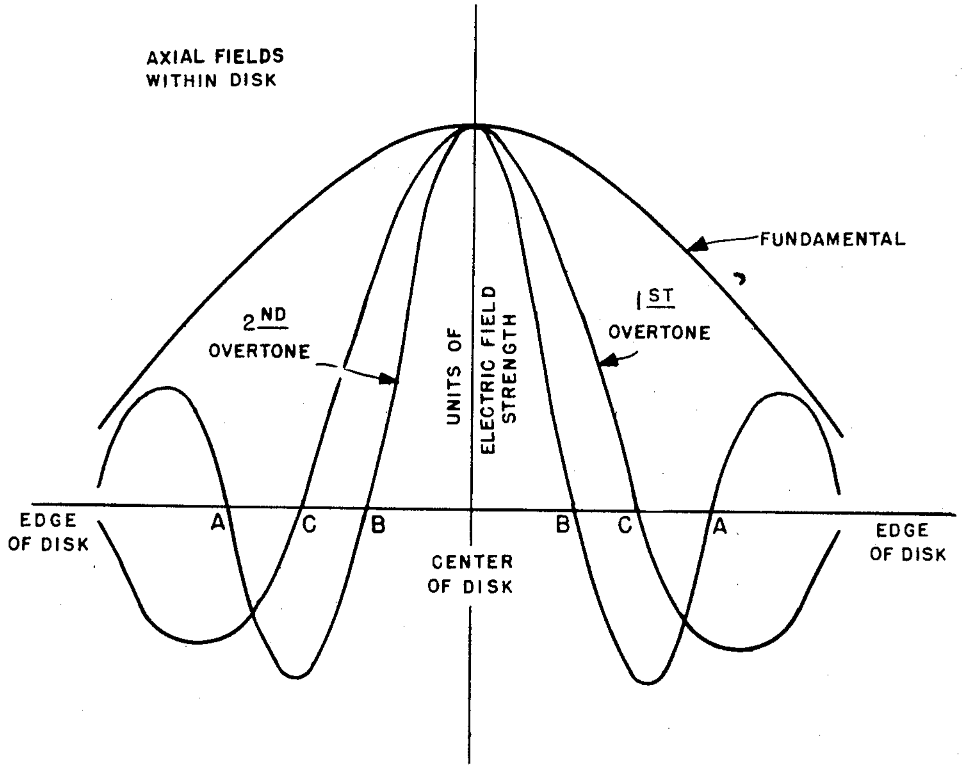

Fig. 2*a* is a graph showing the axial electric fields in a mechanically vibrating disk; including the fundamental, first and second overtones within the disk of Fig. 1.

Figure 3:
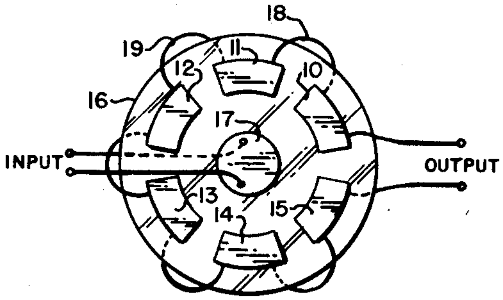
Figure 3A:
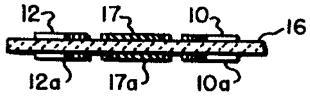

Fig. 3 shows a plan view of one embodiment of a segmented ring electrode on a piezoelectirc ceramic disk transformer according to this invention;

Fig. 3*a* is a cross-sectional view of the embodiment of Fig. 3.

Figure 4:
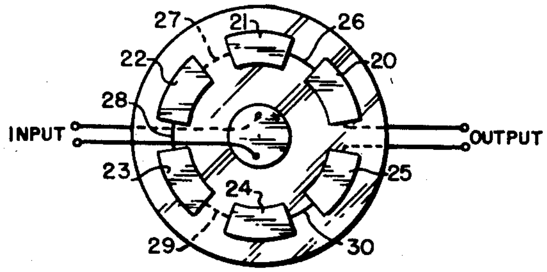

Fig. 4 shows a plan view of another embodiment of a split-segment ring electrode on a piezoelectric transformer with opposite polarization.

Figure 5:
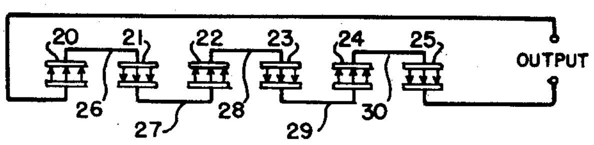

Fig. 5 is a schematic showing of the polarization and the interconnections of the segments of Fig. 4.

Referring now to Fig. 1, the piezoelectric disk 1 is made from a ceramic material which may be, for example only, barium titanate, barium titanate mixed with other titanates, or any other piezoelectric ceramic material. The center electrode 2, the ring electrode 3, and their respective counterparts on the opposite side of the disk, are formed from any suitable conducting material such as silver, platinum, etc. These electrodes are applied to the disk in any desired fashion, since neither the electrode material nor its manner of application form any part of this invention. When the disk is formed of a ferroelectric ceramic material it is suitably prepolarized in an axial or radial direction, the method of polarization being outside the scope of this invention.

In Fig. 2, disk 1 is an axially polarized four-terminal filter having input and output terminals. A high frequency alternating voltage signal is applied to the central electrodes 2 and the output is taken from the ring electrodes 3. The diameter of the disk is so chosen that it resonates at the applied frequency. It is known that the radial resonant frequency of a relatively thin disk is determined essentially by its diameter, which for a fundamental 455 kc. unit would be in the order of about 0.2 inch.

When an alternating voltage signal is applied to the center electrodes 2, in a direction parallel to the axial polarization of the disk, mechanical vibrations are created in a radial direction, i.e., in a plane perpendicular to the axis of polarization. Because of the piezoelectric characteristics of the prepolarized ceramic material, these radial mechanical vibrations generate, in turn, axial alternating voltages between the flat surfaces of the disk. The frequencies of the generated A.-C. voltages at any point on the surface are the same as the frequencies of the radial mechanical vibrations at that point.

Fig. 2*a* shows the electric field distribution at different points on the surface of the disk of Fig. 2, which is axially polarized and driven by voltage signals having frequencies corresponding to the fundamental, first and second overtones, respectively. The center of the disk is taken as the zero point on the X axis and the edges of the disk are plotted to the right and to the left of the center point. The relative voltage amplitudes are plotted on the Y axis.

From an inspection of Fig. 2*a*, it can be readily seen that the fundamental, the first and the second overtones have their maximum strength at the center of the disk. At points A and B the second overtone has its zero or nodal points. The first overtone has its nodes at points C. At the edge of the disk the fundamental is stronger than the first or the second overtones, the fundamental being of the same polarity as the second overtone and of opposite polarity to the first overtone.

No voltage would therefore be induced in a narrow electrode placed at points A or B from a disk resonating in its second overtone. Similarly, no voltage would be produced in an electrode placed at point C from a disk resonating in its first overtone. However, both the fundamental and the first overtone would produce an appreciable voltage at point A and, similarly, the fundamental and the second overtone would produce an output voltage at point C. The response to the fundamental and the second overtone, and the elimination of the first overtone are more desirable in practice because of the greater separation of the response frequencies. It can be mathematically shown that the second overtone is approximately four times the fundamental frequency, while the first overtone is only about 2.5 times, the fundamental. For example, the fundamental resonant frequency of a 0.2 in. thin disk, axially polarized and radially vibrating, is about 455 kc. For some applications, however, a 0.2 in. unit is too small. A disk could be designed for a fundamental frequency of about 180 kc. with a diameter of approximately half an inch, and the electrodes placed at point A, so that the output electrode will contain only the fundamental, the first overtone of about 455 kc., and not the second overtone.

Hence, by proper placement of the outer ring 3 in Fig. 1 the desired overtone and/or the fundamental may be produced. The ability of the disk to selectively generate particular frequencies makes it very suitable for filter work.

In Fig. 2, the disk of Fig. 1 acts as a filter, or a transformer of a given voltage level of one frequency to another voltage level of the same or different frequency, depending on the location of the outer electrodes 3. In addition to its filtering properties, the disk of Fig. 1 also exhibits impedance transformation characteristics. The input impedance $Z_1$, looking into the input terminals with the output terminals open-circuited, is different from the output impedance $Z_2$, looking into the output terminals with the input terminals open-circuited. The input impedance $Z_1$ is mainly determined by the input capacitance formed by the central electrodes 2 and the disk. Similarly, the output impedance $Z_2$ is primarily determined by the capacitance between the ring electrodes 3 and the ceramic disk 1. Since this is true, the input and output capacitances can be varied, within limits, by variation of the electrode areas. If this is done, however, the variation is limited by the size of the disk and the efficient areas of stress distribution. For example, in Fig. 1 a ring electrode 3 is placed at a point corresponding to point C of Fig. 2*a* for second overtone operation, its width is limited by the amount of first overtone which may be tolerated. Similarly, the central electrode cannot be made too small because the electro-mechanical energy transformation efficiency of the disk varies inversely with the area of the central electrode.

The input and output capacitances may also be varied by changing the thickness of the disk, which is equivalent to changing the dielectric between the electrodes. However, the mathematical stress analysis, of which Fig. 2*a* is an experimental confirmation, applies mainly to a very thin disk. And, as soon as the thickness becomes substantial, the vibrational modes tend to be complex thereby decreasing the efficiency of the disk as a filter-transformer.

Therefore, any attempt to either increase or decrease the input and output impedances, merely by changing the electrode areas or by thickening the disk, will result in less efficient operation of the filter element. Moreover, the impedance transformation ratio $Z_1/Z_2$ can be varied only within definite limits. Disks of first overtone operation exhibit maximum possible impedance transformation ratios in the order of 1:10 and become increasingly ineffective when an attempt is made to further increase this ratio.

In Fig. 3 is shown a plan view of one embodiment according to this invention comprising a ceramic disk 16 having a split ring electrode on each face of the disk. The segments of the ring electrodes are designated by reference numerals 10–15 and **10*a*–15*a* respectively. The center electrodes 17 and 17*a* are connected to the input terminals. The segments are interconnected as shown at 18 and 19, i.e., each upper segment is connected electrically to the following bottom segment on the reverse face. The output terminals are connected to segments 10 and 15*a***, respectively. Any number of segments or sections may be utilized, and six pairs are shown in Fig. 3, merely by way of illustration.

Fig. 3*a* is a cross sectional view of the embodiment of Fig. 3 in which the subscript "*a*" denotes a corresponding segment on the opposite side of the disk.

The operation of disk 16 in Fig. 3 is similar to the operation of disk 1 in Fig. 2, and the above description as to polarization and frequency response is equally applicable here. The difference between the embodiments of Fig. 2 and Fig. 3 resides in the fact that while the embodiment of Fig. 2 has limited impedance transformation characteristics, the embodiment of Fig. 3 exhibits excellent impedance transformation properties. This is due to the fact that by segmenting the outer ring electrodes and interconnecting them as shown, the output impedance becomes a function of the inverse of the square of the number of segments. If $n$ is the number of segments, the output impedance will be a function of $1/n^2$. It can therefore be readily seen that the output impedance may be varied practically at will without decreasing the efficiency of the disk.

In Figures 4 and 5 is illustrated another embodiment of the invention which is very similar to the embodiment of Fig. 3, except for the manner of polarization. The direction of polarization is alternately changed in adjacent segments of the ring electrode.

Fig. 4 shows a segmented ring electrode, as in Fig. 3, the segments being 20–25. Each segment has a corresponding segment on the other face of the disk. In this embodiment, after fabrication of the disk and its electrodes, adjacent segments of the ring electrode are subjected to opposite axial electric polarizing fields, while the remaining portion of the disk is axially polarized in one direction only, as in the case of Fig. 3. Adjacent surface electrodes are then connected together by conductors 26–30, as shown. The manner of polarization of the alternate segments can be seen more clearly in Fig. 5, which is a development of the ring electrode only. The output terminals are connected to the bottom segments 20 and 25, respectively.

The result accomplished by the embodiment of Fig. 4 is that the connectors 26–30 are mounted directly on the upper and lower faces of the disk, instead of interconnecting alternate upper and lower segments around the edge of the disk as in the case of Fig. 3. Thus, connectors 26, 28 and 30 are on the upper face, while connectors 27 and 29 are on the bottom face. The disk of Fig. 4 with its electrodes is somewhat easier to manufacture than the one of Fig. 3, since the connectors and the segments may be made in a single operation. The connectors in Fig. 4 can be made of the same material as the electrodes, such as powdered silver.

The impedance transformation characteristics of the embodiment of Fig. 4 are exactly the same as in the case of Fig. 3. The output impedance is a function of $1/n^2$, $n$ being the number of segments on each face of the disk.

The method of interconnecting the segment-electrodes in the embodiments of Figures 3 and 4 can be visualized from the following considerations.

In Fig. 3 the disk is axially polarized in one direction, and therefore, at a particular instant of time, for example, the top segments will have positive electric charges induced therein, while the bottom segments will be negatively charged, or vice versa. By interconnecting the segments, as shown in Fig. 3, the upper "plus" segments are connected to the succeeding bottom "minus" segments. Hence, the voltages induced in each pair of segments are series adding.

The prepolarization of the disk of Fig. 4 is shown in Fig. 5. Due to the alternating sense of polarization, alternating plus and minus electric charges will be induced, at any instant of time, in successive top segments of the disk. For example, top segments 20, 22 and 24 will be positively charged while top segments 21, 23 and 25 will be negatively charged. Similarly, corresponding bottom segments 20, 22 and 24 will be negatively charged while bottom segments 21, 23 and 25 are positively charged. The actual connections can be traced as follows: "positive" upper segment 20 is connected to "minus" upper segment 21, "positive" bottom segment 21 is connected to "minus" bottom segment 22, etc. Hence, in the embodiment of Fig. 4, the voltages induced in each pair of "plus" and "minus" segments are also series added.

Another way of looking at Fig. 5 is to consider each pair of top and bottom segments as a condenser having the ceramic disk as its dielectric. Just as with condensers, the pairs of segments can be connected in series, in parallel, or in any series-parallel combination. The output impedance, looking into the output terminals, depends on the particular interconnection of these pairs of segments.

So far, mention has been made only of splitting the outer electrode. It should be understood that the central electrodes could also be segmented in order to increase the input impedance. Moreover, the input and output terminals could be interchanged, depending on whether a step-up or step-down transformer is desired.

Obviously, many modifications and variations of the present invention are possible in the light of the above teachings. It is therefore to be understood, that within the scope of the appended claims, the invention may be practiced otherwise than as specifically described.

What is claimed is:

1. In a high frequency transformer having input and output terminals for coupling a high impedance circuit to a low impedance circuit, a thin piezoelectric ceramic disk having two main faces; two small circular electrodes placed at the respective centers of said main faces; a number of segment electrodes symmetrically arranged at a radial distance from the center of each main face; means for electrically interconnecting said segment electrodes in series circuit relationship with said output terminals, means for electrically connecting said input terminals across said circular electrodes; the voltage transformation ratio of said transformer being determined by said radial distance, and the impedance transformation ratio being determined by said number of segment electrodes.

2. In a high frequency transformer having input and output terminals for coupling a high impedance circuit to a low impedance circuit, an axially polarized thin piezoelectric ceramic disk having two main faces; two small circular electrodes placed at the respective centers of said main faces; a number of segment electrodes symmetrically arranged at a radial distance from the center of each main face; the axial polarization within the portions of the disk sandwiched between consecutive segment electrodes being in opposite directions, means for electrically interconnecting said output terminals with the segment electrodes of one of said main faces in series circuit relationship, means for electrically connecting said input terminals across said circular electrodes; the voltage transformation ratio of said transformer being determined by said radial distance, and the impedance transformation ratio being determined by said number of segment electrodes.

3. In a high frequency transformer having input and output terminals for coupling a high impedance circuit to a low impedance circuit, an axially polarized thin piezoelectric ceramic disk having two main faces; two small circular electrodes placed at the respective centers of said main faces; a number of segment electrodes symmetrically arranged at a radial distance from the center of each main face; means for electrically connecting said output terminals in series with said segments so that each segment of one face is connected with the succeeding segment of the opposite face, means for electrically connecting said input terminals across said circular electrodes, the voltage transformation ratio of said transformer being determined by said radial distance, and the impedance transformation ratio being determined by said number of segment electrodes.

4. In combination, a relatively thin disk-shaped axially polarized piezoelectric transformer having an upper and a lower face, a central electrode and at least two interconnected equidistant segment electrodes symmetrically arranged on both faces, means for applying a radio-frequency signal to the center electrodes for developing resonant mechanical vibrations in said transformer and two output terminals connected to symmetrically disposed segments on each face for extracting a radio-frequency voltage signal.

5. In combination, a relatively thin disk-shaped axially polarized piezoelectric body having an upper and a lower face, a central input electrode and at least a pair of series connected equidistant segment electrodes symmetrically arranged on both faces, the polarization between succeeding segments being in opposite directions; a radio-frequency signal applied to the input electrodes for developing resonant mechanical vibrations in the axial direction between the center electrodes and resonant radial vibrations in the remaining portion of the disk, and two output terminals connected to said body for extracting a radio frequency voltage signal.

6. An axially polarized ceramic disk transformer having two main faces, a central input electrode and $n$ interconnected segment electrodes symmetrically arranged on both faces, the polarization between succeeding segment electrodes being in opposite directions, two input terminals connected to the center electrodes and two output terminals connected to said disk, the impedance transformation ratio of the transformer varying with $1/n^2$.

References Cited in the file of this patent

UNITED STATES PATENTS

| | | |
|---|---|---|
| 2,262,966 | Rohde | Nov. 18, 1941 |
| 2,373,431 | Sykes | Apr. 10, 1945 |
| 2,830,274 | Rosen et al. | Apr. 8, 1958 |
| 2,863,076 | Koren et al. | Dec. 2, 1958 |